US011868646B2

(12) United States Patent
Eliash et al.

(10) Patent No.: US 11,868,646 B2
(45) Date of Patent: Jan. 9, 2024

(54) READ LEVEL TRACKING BY RANDOM THRESHOLD MOVEMENT WITH SHORT FEEDBACK LOOP

(71) Applicant: Western Digital Technologies, Inc., San Jose, CA (US)

(72) Inventors: Tomer Eliash, Kfar Saba (IL); Alexander Bazarsky, Holon (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 178 days.

(21) Appl. No.: 17/453,047

(22) Filed: Nov. 1, 2021

(65) Prior Publication Data

US 2023/0134545 A1    May 4, 2023

(51) Int. Cl.
*G06F 3/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
See application file for complete search history.

(56) References Cited

U.S. PATENT DOCUMENTS

| 2019/0354313 | A1* | 11/2019 | Sheperek | G11C 29/028 |
| 2020/0066353 | A1* | 2/2020 | Pletka | G06F 3/0604 |
| 2020/0136507 | A1* | 4/2020 | Tiruchengode Tirumurugga Bupathi | H04R 3/02 |

* cited by examiner

*Primary Examiner* — Craig S Goldschmidt
(74) *Attorney, Agent, or Firm* — PATTERSON + SHERIDAN, LLP; Steven H. VerSteeg (57) ABSTRACT

A data storage device includes a memory device and a controller coupled to the memory device. The controller is configured to determine a read threshold on a wordline, adjust a read threshold voltage level associated with the read threshold, determine an adjusted read threshold at the adjusted read threshold voltage level, where the adjusted read threshold is different from the read threshold, compare the adjusted read threshold to the read threshold, and calibrate the read threshold based on the comparing. The controller is further configured to analyze a bit error rate (BER) difference based on the calibrating and/or a previous read threshold voltage level movement, choose a next target read threshold for next calibration, and read a second page at the next target read threshold.

19 Claims, 9 Drawing Sheets

READ LEVEL TRACKING BY RANDOM THRESHOLD MOVEMENT WITH SHORT FEEDBACK LOOP

BACKGROUND OF THE DISCLOSURE

Field of the Disclosure

Embodiments of the present disclosure generally relate to data storage devices, such as solid state drives (SSDs), and, more specifically, read threshold calibration.

Description of the Related Art

As memory device technology improves, flash memory has become smaller and more dense. However, with smaller and more dense memories, device reliability becomes more of a concern as it can be affected by factors, such as process uniformity. Uneven process uniformity may result in increased variability between dies, blocks, and pages of the memory device across different endurance, retention, temperature, and disturbance conditions. In order to ensure quality of service (QoS), tracking and adapting read thresholds may be needed, such that read throughput and input/output operations per second (IOPS) requirements are met.

Read threshold calibration may be conducted through a process of applying a number of senses and then sequentially calculating a syndrome weight (SW) as an estimate of a bit error rate (BER). Alternatively, read threshold calibration may be conducted through a process of searching for valleys in a cell voltage distribution (CVD) by measuring a difference of conducting cells between different voltage points. Optimization of the read threshold calibration may include grouping blocks together that are programmed in similar time periods and have similar temperature (TRT) ranges. The groups are optimized using a read threshold measurement of a representative block and/or wordline. The measurements, with or without a correction factor, are then applied across the other blocks and wordlines of the TRT grouped blocks to adjust the read thresholds of the blocks and the wordlines. Because the TRT group threshold calibration may be executed periodically, and for a plurality of TRT groups, in order to update the thresholds of the relevant blocks and wordlines, the system performance may be impacted.

Thus, there is a need in the art for an improved read threshold tracking and calibration.

SUMMARY OF THE DISCLOSURE

The present disclosure generally relates to data storage devices, such as solid state drives (SSDs), and, more specifically, read threshold calibration. A data storage device includes a memory device and a controller coupled to the memory device. The controller is configured to determine a read threshold on a wordline, adjust a read threshold voltage level associated with the read threshold, determine an adjusted read threshold at the adjusted read threshold voltage level, where the adjusted read threshold is different from the read threshold, compare the adjusted read threshold to the read threshold, and calibrate the read threshold based on the comparing. The controller is further configured to analyze a bit error rate (BER) difference based on the calibrating and/or a previous read threshold voltage level movement, choose a next target read threshold for next calibration, and read a second page at the next target read threshold.

In one embodiment, a data storage device includes a memory device and a controller coupled to the memory device. The controller is configured to determine a first read threshold for a first page, adjust a first read threshold voltage level associated with the first read threshold, determine a first adjusted read threshold at the adjusted first read threshold voltage level, where the adjusted first read threshold is different from the first read threshold, compare the adjusted first read threshold to the first read threshold, and calibrate the first read threshold based on the comparing.

In another embodiment, a data storage device includes a memory device and a controller coupled to the memory device. The controller is configured to read a first page at a target read threshold, calibrate the target read threshold, analyze a bit error rate (BER) difference based on the calibrating and/or a previous read threshold voltage level movement, and read a second page at the next target read threshold, where the second page is substantially similar to the first page.

In another embodiment, a data storage device includes memory means and a controller coupled to the memory means. The controller is configured to sense a first page at a first read threshold voltage and determine a first failed bit count (FBC) of the first page, decrease the first read threshold voltage of a first state of a second page by a voltage shift, sense the second page at the decreased first read threshold voltage and determine a second FBC of the second page, and compare the second FBC to the first FBC.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, read threshold calibration. The present disclosure provides a simple way to track read thresholds. The basic premise is to start with read thresholds acquired from a BER Estimation Scan (BES) baseline on a representative Word Line (WL), and from that point each read done on that group will move by few mV to the left (reduce the read threshold voltage level) or to the right (increase the read threshold voltage level). After each read, the system checks the previous BER level that was generated from the WL (e.g., by reading a status from an ECC engine) and using the previous BER level, determines if the movement was in the right direction or not. This kind of simple tracking will "lock" on the average best read level, and in case of slow cell movement (due to time, temperature, etc.) the read levels will move with it as well. Such tracking reduces the necessity of invoking the BES operation and reduces "performance hiccups". In addition, cross temperature events, which are generally difficult to handle, become more manageable since temperature naturally doesn't change very fast. The present technology is especially suited for long sequential reads during which the conditions (such as temperature) change. In this scenario, the BER would rise to some threshold before a BES read threshold calibration operation would reduce the BER. Using the present technology, the BER remains low without elevating to that threshold—and also without investing the calibration time and performance hiccup.

A data storage device includes a memory device and a controller coupled to the memory device. The controller is configured to determine a read threshold on a wordline (WL), adjust a read threshold voltage level associated with the read threshold, determine an adjusted read threshold at the adjusted read threshold voltage level, where the adjusted read threshold is different from the read threshold, compare the adjusted read threshold to the read threshold, and calibrate the read threshold based on the comparing. The controller is further configured to analyze a bit error rate (BER) difference based on the calibrating and/or a previous read threshold voltage level movement, choose a next target read threshold for next calibration, and read a second page at the next target read threshold.

Figure 1:
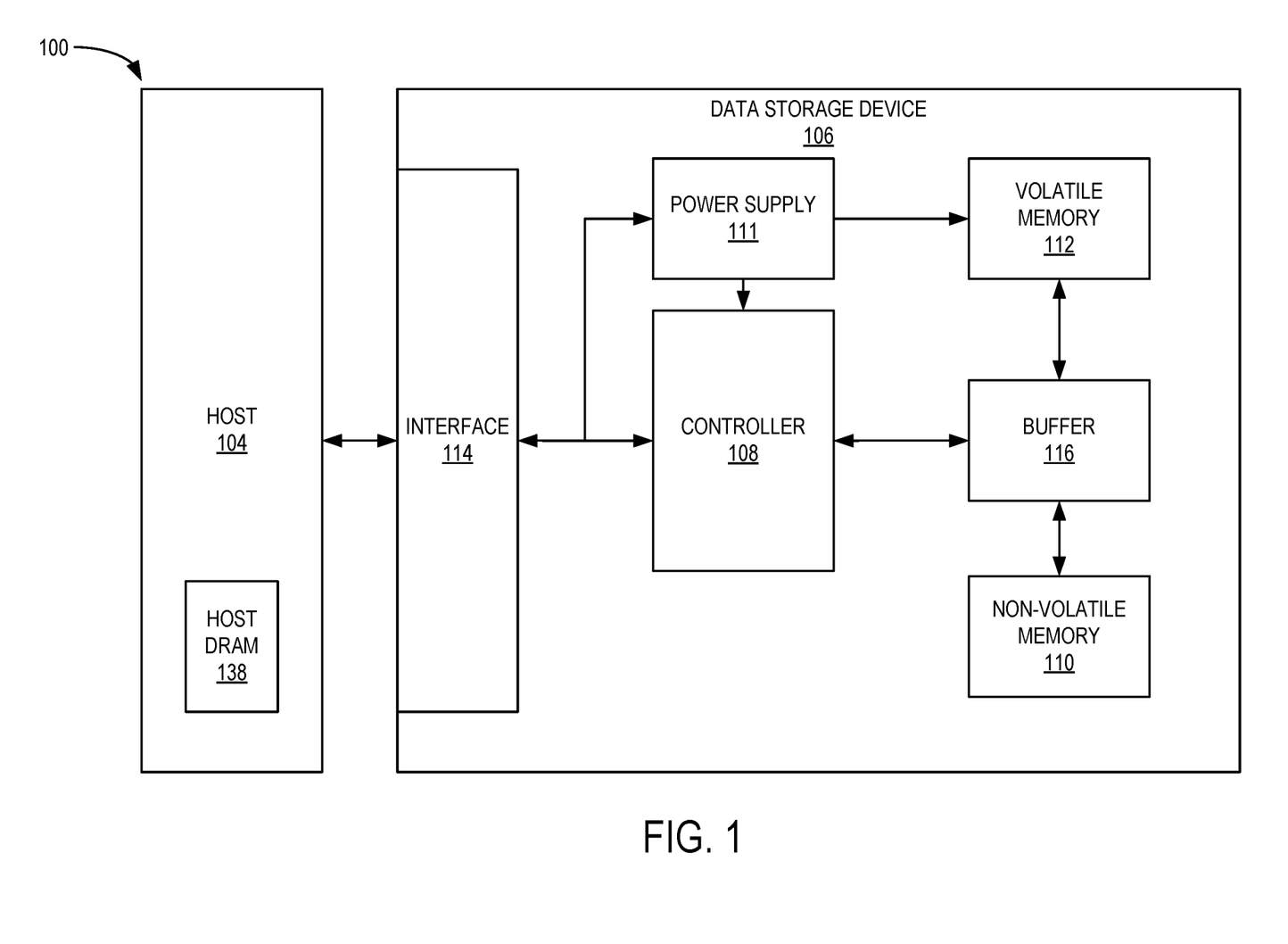
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe×1, ×4, ×8, ×16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
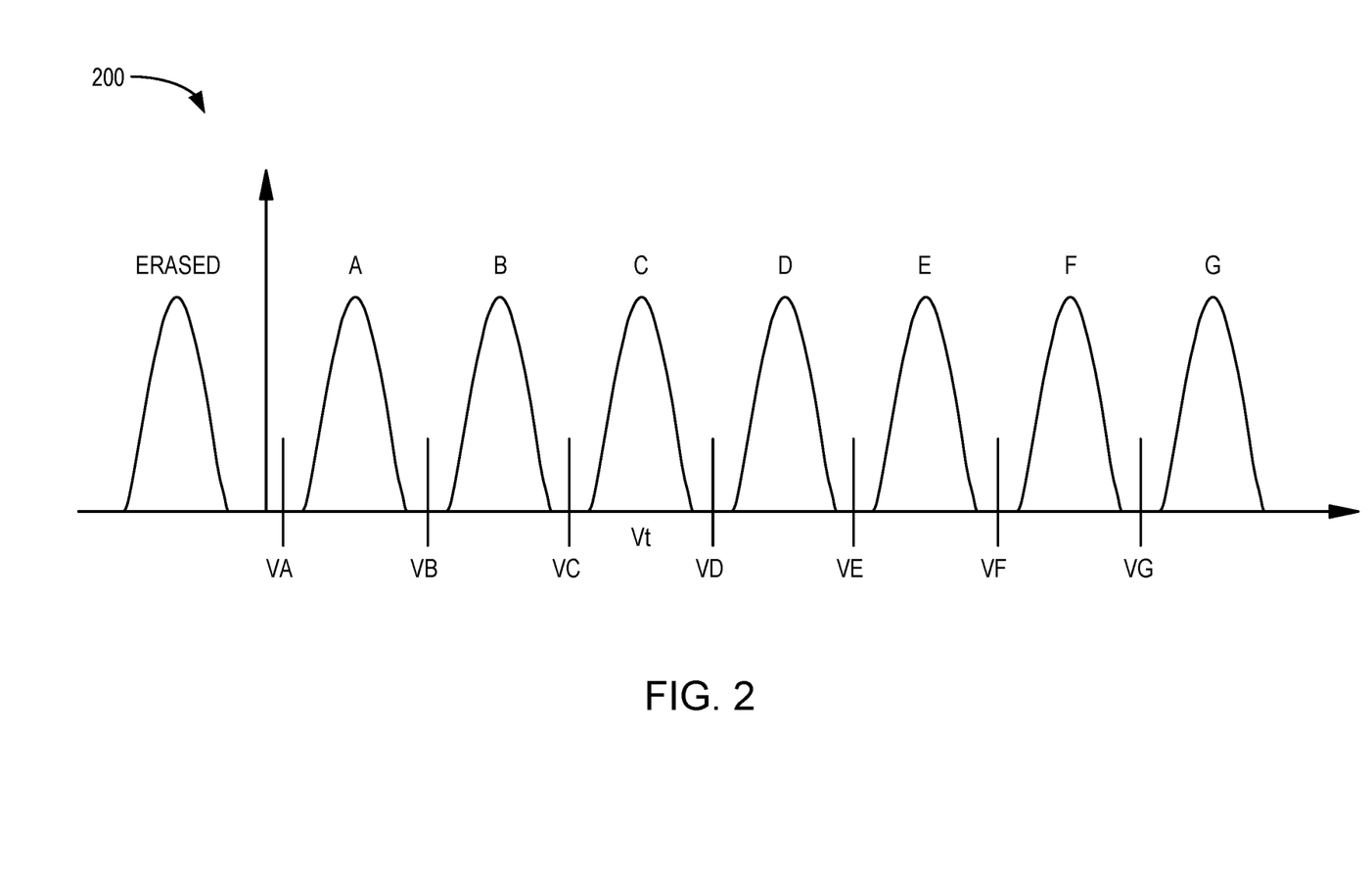
FIG. 2 is a graph illustrating threshold voltages for TLC memory, according to certain embodiments.

FIG. 2 is a graph 200 illustrating threshold voltages for TLC memory, according to certain embodiments. TLC memory includes 3 bits, where each bit may have a program state of either 0 or 1. The program state refers to the state of the memory cell, whether the memory cell is empty (i.e., no data exists) or the memory cell is programmed (i.e., data exists). Furthermore, the number of unique combinations of program states can be solved in the following equation: (Total number of voltage levels)=2^(number of bits per memory cell). For the TLC memory, the number of voltage levels is eight because 2^3=8.

As the number of bits of the memory cell increases, the memory cell can record more information leading to larger data storage. Furthermore, the equation for the unique combination of program states may be applied to SLC memory, TLC memory, QLC memory, penta-layer cell (PLC) memory, and other memory densities.

The program state of 0 refers to a programmed state, whereas the program state of 1 refers to an erased state. The TLC memory has 8 voltage levels, where one is erased and seven are programmed. Furthermore, the one voltage level that is erased has a bit combination of program state 111. For any memory cell, if the bit combination only contains the program state 1, then the program state is erased (e.g., 1 for SLC, 11 for MLC, and 1111 for QLC). Listing from lowest threshold voltage, denoted by Vt on the x-axis, to highest threshold voltage in FIG. 2A, the voltage levels are 111 for the erased cell state, 110 for cell state A, 100 for cell state B, 000 for cell state C, 010 for cell state D, 011 for cell state E, 001 for cell state F, and 101 for cell state G.

The bits for the cell state (i.e., ###) are upper page, middle page, lower page. Furthermore, the lines between the curves are labeled VA, VB, VC, VD, VE, VF, and VG are related to the threshold or reference voltage. For other memory cells, the number of threshold or reference voltages can be solved by the following equation: (number of threshold or reference voltages)=(total number of voltage levels)−1. The individual pages of data can be read by performing a number of comparisons at one or more threshold points and determining whether the cell voltage is lower or higher than the threshold. Each voltage curve represents a voltage distribution for the respective cell state. It is to be understood that the cell state distribution curve is an example embodiment. It is to be further understood that a tail of the voltage curve of a cell state may overlap with a head of the voltage curve of an adjacent cell state and vice-versa.

Figure 3:
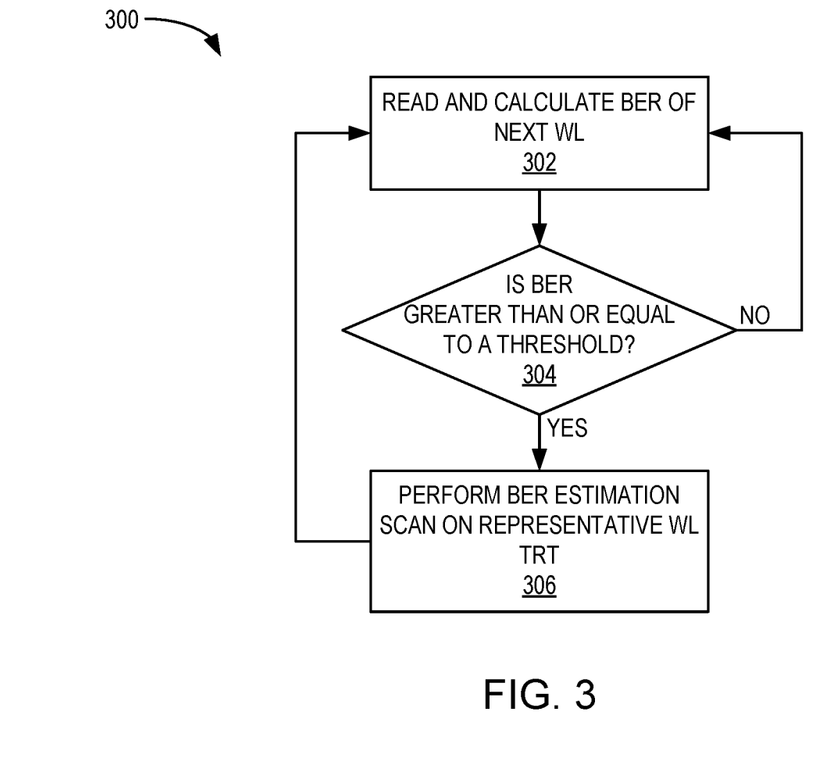
FIG. 3 is a flow diagram illustrating a method of calibrating read thresholds, according to certain embodiments.

FIG. 3 is a flow diagram illustrating a method 300 of calibrating read thresholds, according to certain embodiments. Aspects of the storage system 100 of FIG. 1 may be referenced herein for exemplary purposes. For example, the controller 108 may implement method 300 to calibrate one or more read thresholds of one or more wordlines (WLs) or one or more pages of the NVM 110, where the one or more read thresholds may be the threshold voltages shown in graph 200 of FIG. 2. It is to be understood that the embodiments described herein are not limited to any memory density. For example, the embodiments may be applicable to SLC memory, MLC memory, TLC memory, QLC memory, PLC memory, and the like.

At block 302, the controller 108 reads and calculates a BER of a next WL of a page of the NVM 110. At block 304, the controller 108 determines if the calculated BER is greater than or equal to a threshold. The threshold may be a maximum BER threshold, such that if the BER of the WL is greater than the threshold, the controller 108 may avoid programming data to that WL. If the calculated BER is not greater than or equal to the threshold, then the controller 108 reads and calculates a BER of a next WL at block 302, where the next WL may be an adjacent WL of the WL previously read.

However, if the calculated BER is greater than or equal to the threshold at block 304, then the controller 108 performs a BER estimation scan (BES) on a representative WL of the TRT group. The representative WL may be a WL of a representative page of the TRT group. In some examples, a TRT group may have more than 1 representative WL or page. Furthermore, after performing the BES on the representative WL, the controller 108 may adjust or shift the read threshold of the WLs of the TRT group based on the results of the BES.

Figure 4:
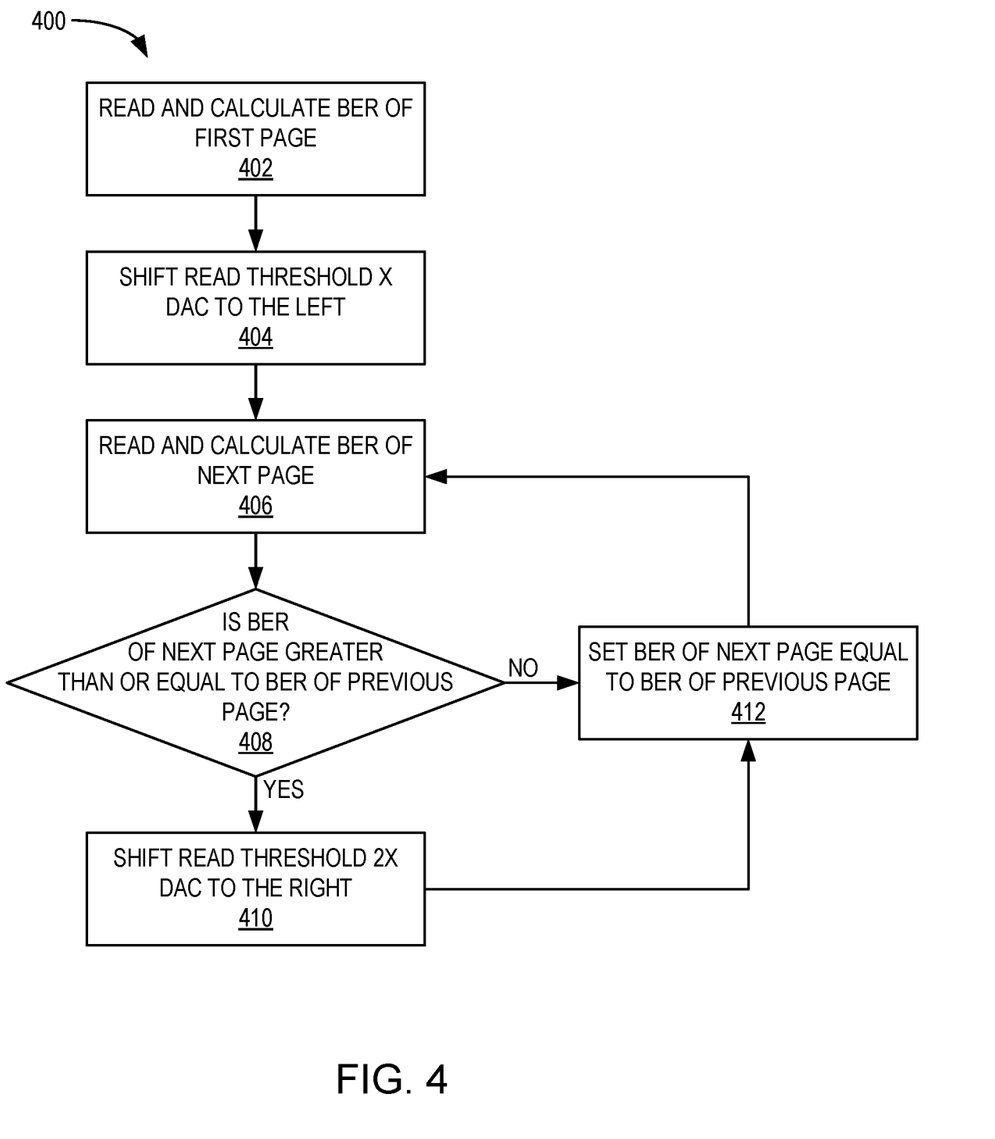
FIG. 4 is a flow diagram illustrating a method of calibrating read thresholds for a single state, according to certain embodiments.

FIG. 4 is a flow diagram illustrating a method 400 of calibrating read thresholds for a single state, according to certain embodiments. Method 400 may be used for each cell state of the memory device. For example, method 400 may be implemented in a round robin scheme for each of the cell states of the memory device. Aspects of the storage system 100 of FIG. 1 may be referenced herein for exemplary purposes. For example, the controller 108 may implement method 400 to calibrate one or more read thresholds of one or more WLs or one or more pages of the NVM 110, where the one or more read thresholds may be the threshold voltages shown in graph 200 of FIG. 2. It is to be understood that the embodiments described herein are not limited to any memory density. For example, the embodiments may be applicable to SLC memory, MLC memory, TLC memory, QLC memory, PLC memory, and the like.

At block 402, the controller 108 reads and calculates a BER of a first page of a TRT group. At block 404, the controller 108 shifts a read threshold of a cell state (e.g., cell state A or cell state G) to the left (i.e., in the negative voltage direction) by a digital to analog converter (DAC) value. In one embodiment, the DAC value may be about 12.5 mV. The previously listed value is not intended to be limiting, but to provide an example of a possible embodiment. For example, referring to FIG. 2, when the read thresholds for cell state A are shifted to the left, VA and VB are shifted by 12.5 mV in the negative Vt direction.

At block 406, the controller 108 reads and calculates the BER of a next page at the shifted read threshold voltage, where the next page may be a page that is adjacent to the first page. For example, in TLC memory, if the lower page was read at block 402, then the middle page is read at block 406. In other examples, the next page may be an adjacent page of the same or adjacent block. At block 408, the controller 108 determines if the next page (e.g., the middle page) is greater than or equal to the BER of the previous page (e.g., the lower page). If the BER of the next page (e.g., the middle page) is not greater than or equal to the BER of the previous page (e.g., the lower page) at block 408, then the controller 108 sets the BER of the next page (e.g., the middle page) equal to the BER of the previous page (e.g., the lower page) at block 412. By setting the BER of the next page equal to the BER of the previous page, the maximum calculated BER for the cell state of the TRT group may be maintained.

However, if the BER of the next page (e.g., the middle page) is greater than or equal to the BER of the previous page (e.g., the lower page) at block 408, then the controller 108 shifts the read threshold by two DAC values to the right (i.e., in the positive voltage direction) at block 410. Shifting the read threshold by two DAC values may effectively shift the original read threshold (i.e., before the first DAC shift to the left) by a DAC value to the right. At block 412, the controller 108 sets the BER of the next page (e.g., the middle page) equal to the BER of the previous page (e.g., the lower page). After setting the BER of the next page (e.g., the middle page) equal to the BER of the previous page (e.g., the lower page) at block 412, method 400 returns to block 406, where the controller 108 reads and calculates a BER of a next page.

Figure 5:
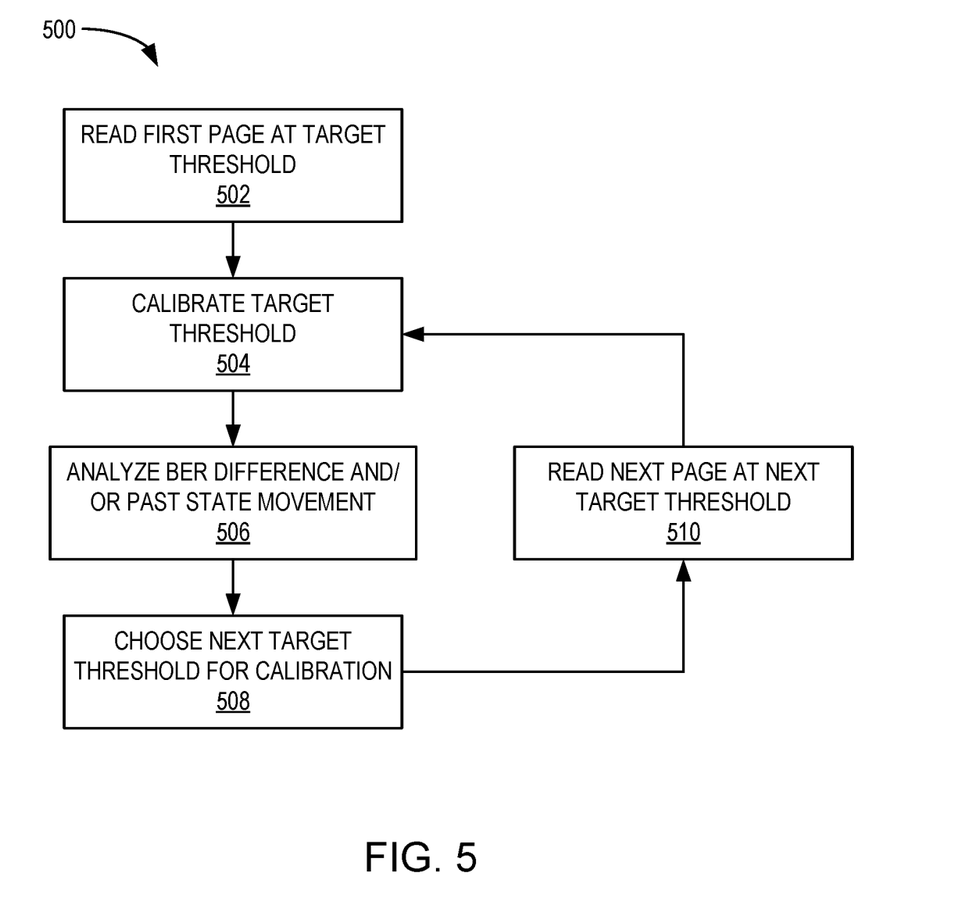
FIG. 5 is a flow diagram illustrating a method of calibrating read thresholds for multiple states, according to certain embodiments.

FIG. 5 is a flow diagram illustrating a method 500 of calibrating read thresholds for multiple states, according to certain embodiments. Method 500 may be a sequential read that traverses multiple logical pages of a TRT group. Aspects of the storage system 100 of FIG. 1 may be referenced herein for exemplary purposes. For example, the controller 108 may implement method 500 to calibrate one or more read thresholds of one or more WLs or one or more pages of the NVM 110, where the one or more read thresholds may be the threshold voltages shown in graph 200 of FIG. 2. It is to be understood that the embodiments described herein are not limited to any memory density. For example, the embodiments may be applicable to SLC memory, MLC memory, TLC memory, QLC memory, PLC memory, and the like.

At block 502, the controller 108 reads a first page at a target threshold. For example, the target threshold may be VA of FIG. 2. At block 504, the controller 108 calibrates the target threshold. For example, calibrating the target threshold may utilize method 400 of FIG. 4, including reading and calculating a BER of a first page, adjusting a read threshold by a DAC value, reading and calculating a BER of a second page at the adjusted read threshold, and comparing the calculated BERs. At block 506, the controller 108 analyzes a BER difference of the previous read threshold calibrations for a cell state and/or past cell state read threshold movement. Furthermore, because of the analyzing at block 506, the controller 108 may more accurately or pre-emptively move read thresholds based on analyzed trends. Thus, a BES operation may not be needed, which may result in better data storage device 106 performance. At block 508, the controller 108 chooses a next target threshold for calibration. For example, the next target threshold may be VB of FIG. 2. In some embodiments, the controller 108 choses the next target threshold in a round robin scheme. At block 510, the controller 108 reads the next page at the next target threshold. Method 500 returns to block 504.

FIGS. 6A-6D are flow diagrams illustrating a method 600 of calibrating read thresholds for a page of a memory architecture, such as TLC memory, according to certain embodiments. Aspects of the storage system 100 of FIG. 1 may be referenced herein for exemplary purposes. For example, the controller 108 may implement method 600 to calibrate one or more read thresholds of one or more WLs or one or more pages of the NVM 110, where the one or more read thresholds may be the threshold voltages shown in graph 200 of FIG. 2. It is to be understood that the embodiments described herein are not limited to any memory density. For example, the embodiments may be applicable to SLC memory, MLC memory, TLC memory, QLC memory, PLC memory, and the like.

Figure 6A:
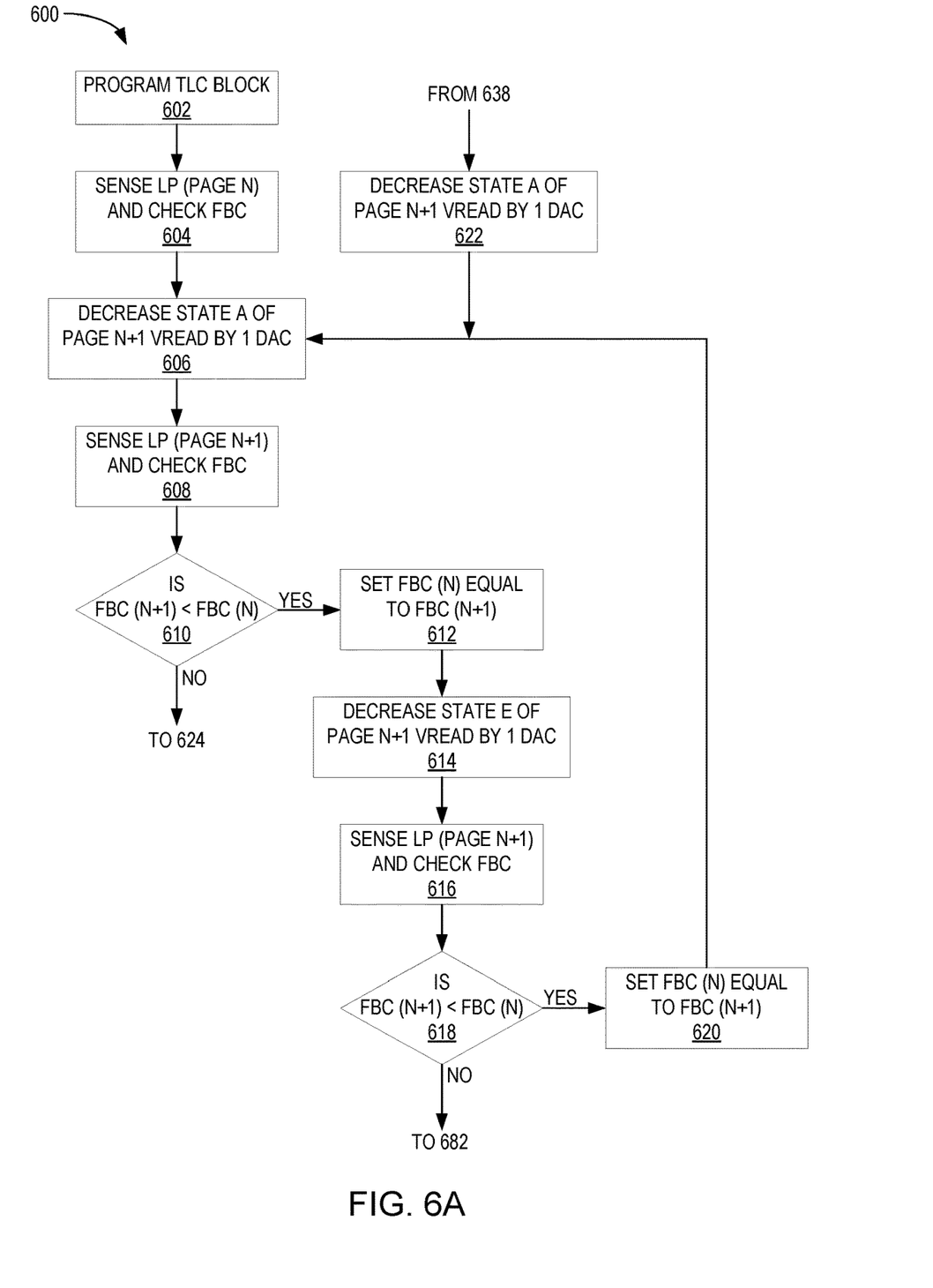
FIGS. 6A-6D are flow diagrams illustrating a method of calibrating read thresholds for a page of a memory architecture, according to certain embodiments.

Referring to FIG. 6A, at block 602, a TLC block of the NVM 110 is programmed. A TLC block includes a lower page (LP), a middle page (MP), and an upper page (UP). In embodiments regarding a QLC block, the QLC block includes a LP, a MP, an UP, and a top page (TP). At block 604, the controller 108 senses a LP of a first set of pages, where the first set of pages includes a LP, a MP, and a UP, and checks a failed bit count (FBC) of the sensed LP. At block 606, the controller 108 decreases read thresholds associated with cell state A of a second set of pages by a DAC level, where the second set of pages may be adjacent to the first set of pages. The DAC level may be about 12.5 mV. At block 608, the controller 108 senses the LP of the second set of pages and checks the FBC of the sensed LP. At block 610, the controller 108 determines if the FBC of the LP of the second set of pages is less than the FBC of the LP of the first set of pages.

Figure 6B:
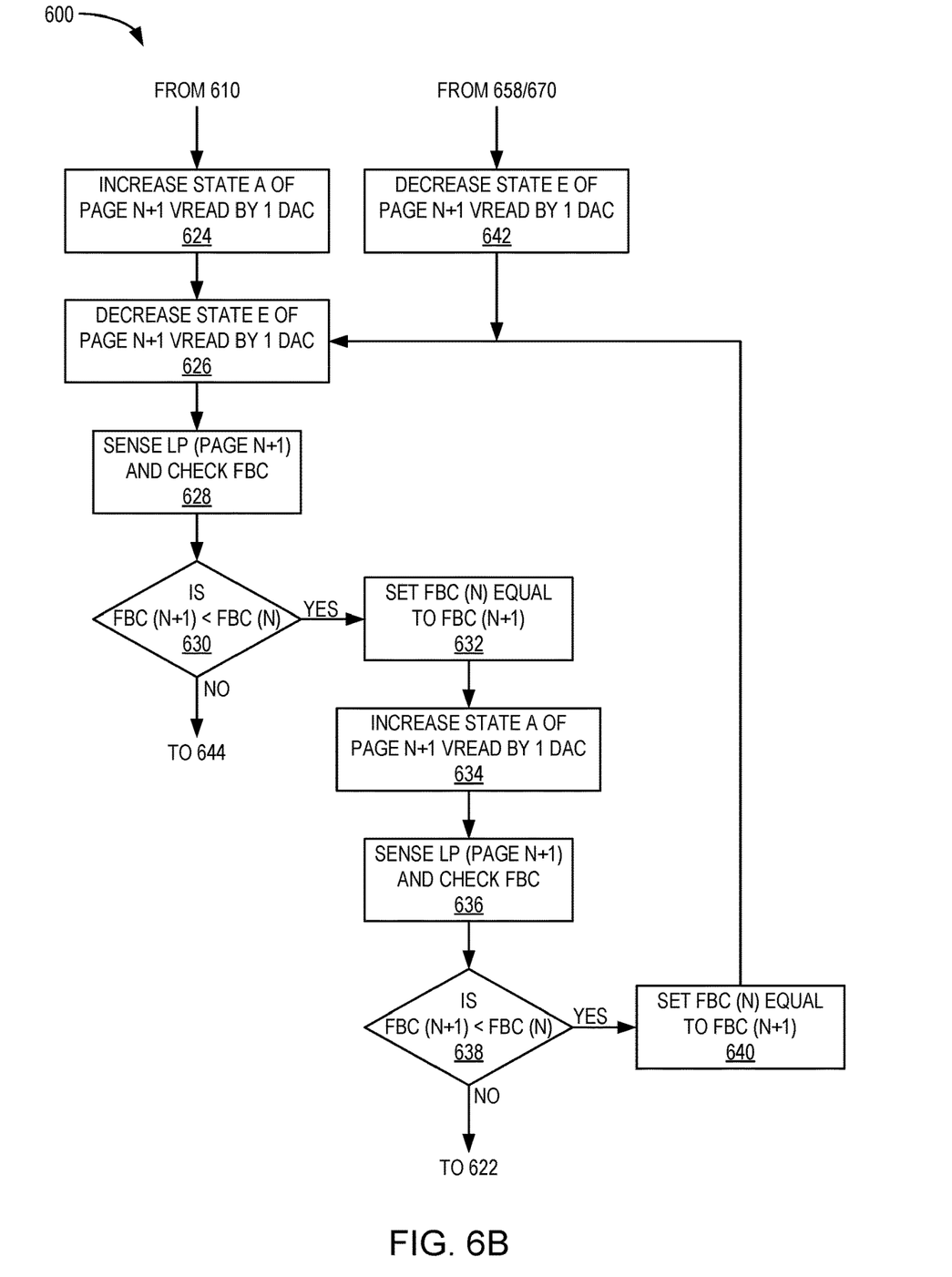

If the FBC of the LP of the second set of pages is not less than the FBC of the LP of the first set of pages at block 610, then method 600 continues to block 624 of FIG. 6B, where the read thresholds of cell state A of the second set of pages are increased by the DAC value. However, if the FBC of the LP of the second set of pages is less than the FBC of the LP of the first set of pages at block 610, then the controller 108 sets the FBC of the first set of pages equal to the FBC of the second set of pages at block 612. At block 614, the controller 108 decreases the read thresholds of cell state E of the second set of pages by the DAC value.

At block 616, the controller 108 senses the LP of the second set of pages and checks the FBC of the sensed LP. At block 618, the controller 108 determines if the FBC of the LP of the second set of pages is less than the FBC of the LP of the first set of pages. If the FBC of the LP of the second set of pages is not less than the FBC of the LP of the first set of pages at block 618, then method 600 continues to block 682 of FIG. 6D, where the read thresholds of cell state E of the second set of pages are increased by the DAC value. However, if the FBC of the LP of the second set of pages is less than the FBC of the LP of the first set of pages at block 618, then the controller 108 sets the FBC of the first set of pages equal to the FBC of the second set of pages at block 620. Method 600 then returns to block 606.

Referring to FIG. 6B, at block 624, the controller 108 increases read thresholds associated with cell state A of the second of pages by the DAC level. At block 626, the controller 108 decreases read thresholds associated with cell state E of the second of pages by the DAC level. By returning the read thresholds of cell state A back to the previous read thresholds and shifting the read thresholds of cell state E, the controller 108 may be able to optimize read thresholds for a single cell state more effectively. In other words, rather than having to solve for two variables, only one variable is unknown. At block 628, the controller 108 senses the LP of the second set of pages and checks the FBC of the sensed LP. At block 630, the controller 108 determines if the FBC of the LP of the second set of pages is less than the FBC of the LP of the first set of pages.

Figure 6C:
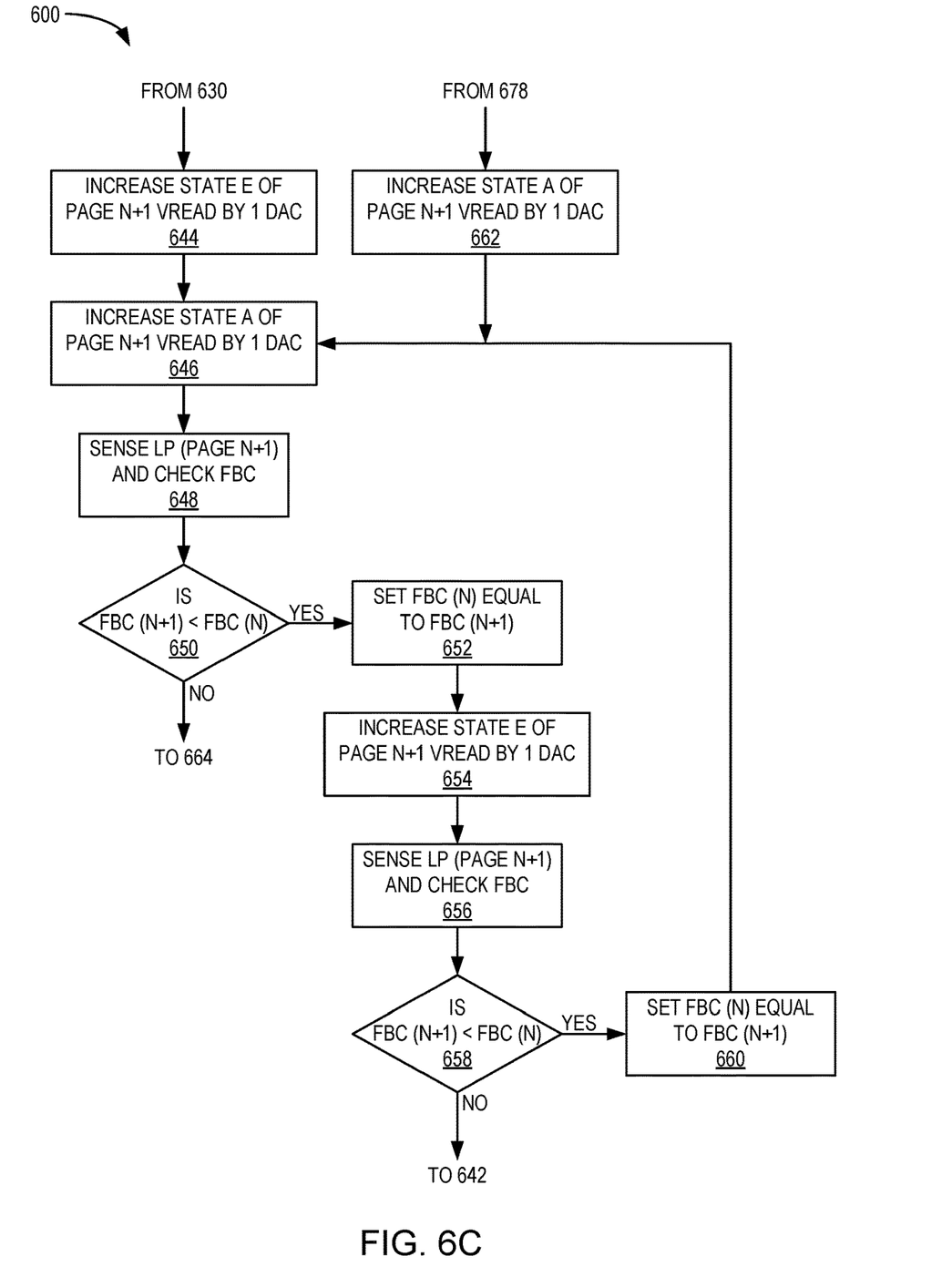
Figure 6D:
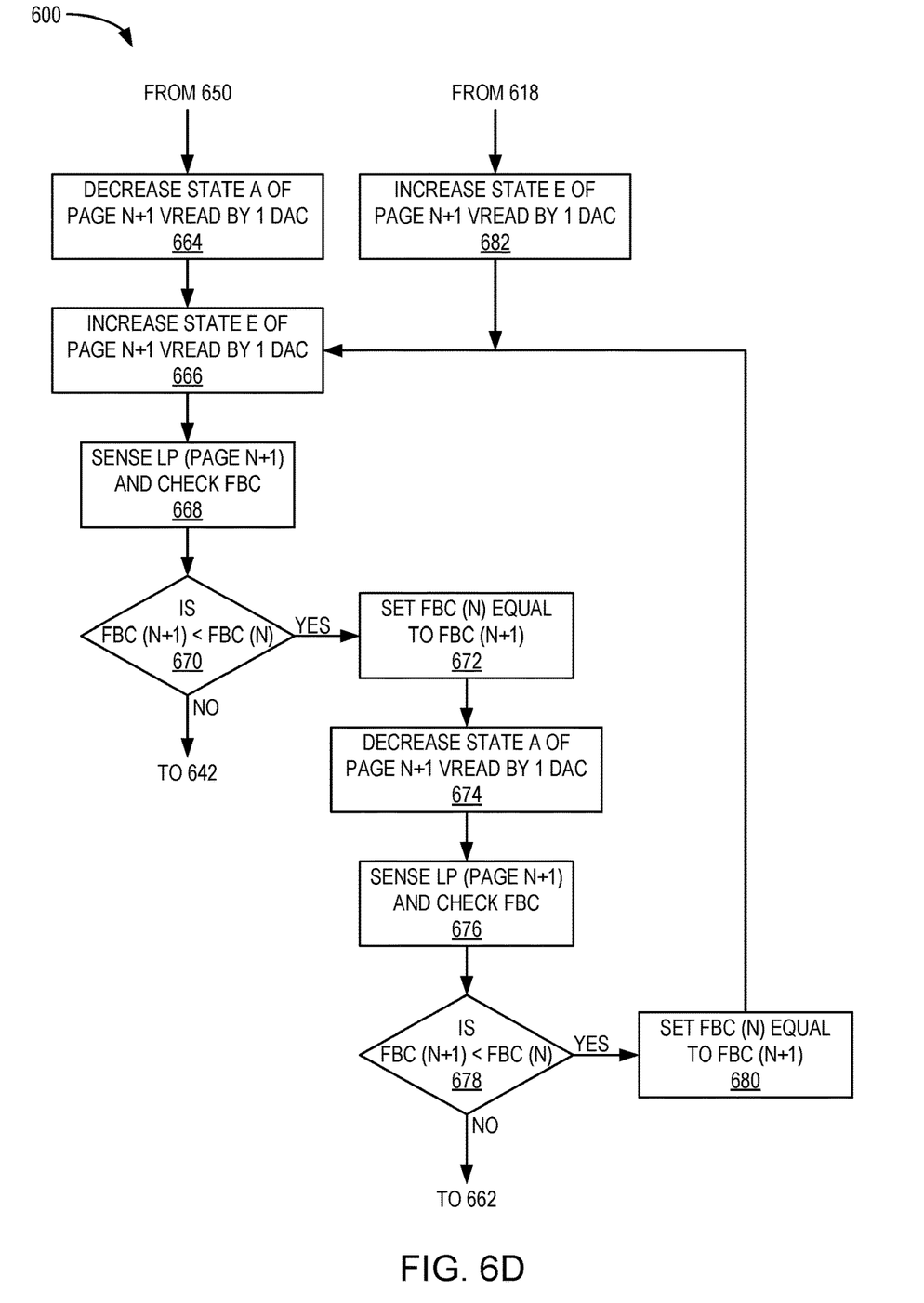

If the FBC of the LP of the second set of pages is not less than the FBC of the LP of the first set of pages at block 610, then method 600 continues to block 644 of FIG. 6C, where the read thresholds of cell state E of the second set of pages are increased by the DAC value. However, if the FBC of the LP of the second set of pages is less than the FBC of the LP of the first set of pages at block 630, then the controller 108 sets the FBC of the first set of pages equal to the FBC of the second set of pages at block 632. At block 634, the controller 108 increases the read thresholds of cell state A of the second set of pages by the DAC value.

At block 636, the controller 108 senses the LP of the second set of pages and checks the FBC of the sensed LP. At block 638, the controller 108 determines if the FBC of the LP of the second set of pages is less than the FBC of the LP of the first set of pages. If the FBC of the LP of the second set of pages is not less than the FBC of the LP of the first set of pages at block 638, then method 600 continues to block 622 of FIG. 6A, where the read thresholds of cell state A of the second set of pages are decreased by the DAC value. However, if the FBC of the LP of the second set of pages is less than the FBC of the LP of the first set of pages at block 638, then the controller 108 sets the FBC of the first set of pages equal to the FBC of the second set of pages at block 640. Method 600 then returns to block 626.

Referring to FIG. 6C, at block 644, the controller 108 increases read thresholds associated with cell state E of the second of pages by the DAC level. At block 646, the controller 108 increases read thresholds associated with cell state A of the second of pages by the DAC level. By returning the read thresholds of cell state E back to the previous read thresholds and shifting the read thresholds of cell state A, the controller 108 may be able to optimize read thresholds for a single cell state more effectively. In other words, rather than having to solve for two variables, only one variable is unknown. At block 648, the controller 108 senses the LP of the second set of pages and checks the FBC of the sensed LP. At block 650, the controller 108 determines if the FBC of the LP of the second set of pages is less than the FBC of the LP of the first set of pages.

If the FBC of the LP of the second set of pages is not less than the FBC of the LP of the first set of pages at block 650, then method 600 continues to block 664 of FIG. 6D, where the read thresholds of cell state A of the second set of pages are decreased by the DAC value. However, if the FBC of the LP of the second set of pages is less than the FBC of the LP of the first set of pages at block 650, then the controller 108 sets the FBC of the first set of pages equal to the FBC of the second set of pages at block 652. At block 654, the controller 108 increases the read thresholds of cell state E of the second set of pages by the DAC value.

At block 656, the controller 108 senses the LP of the second set of pages and checks the FBC of the sensed LP. At block 658, the controller 108 determines if the FBC of the LP of the second set of pages is less than the FBC of the LP of the first set of pages. If the FBC of the LP of the second set of pages is not less than the FBC of the LP of the first set of pages at block 658, then method 600 continues to block 642 of FIG. 6B, where the read thresholds of cell state E of the second set of pages are decreased by the DAC value. However, if the FBC of the LP of the second set of pages is less than the FBC of the LP of the first set of pages at block 658, then the controller 108 sets the FBC of the first set of pages equal to the FBC of the second set of pages at block 660. Method 600 then returns to block 646.

Referring to FIG. 6D, at block 650, the controller 108 decreases read thresholds associated with cell state A of the second of pages by the DAC level. At block 666, the controller 108 increases read thresholds associated with cell state E of the second of pages by the DAC level. By returning the read thresholds of cell state A back to the previous read thresholds and shifting the read thresholds of cell state E, the controller 108 may be able to optimize read thresholds for a single cell state more effectively. In other words, rather than having to solve for two variables, only one variable is unknown. At block 668, the controller 108 senses the LP of the second set of pages and checks the FBC of the sensed LP. At block 670, the controller 108 determines if the FBC of the LP of the second set of pages is less than the FBC of the LP of the first set of pages.

If the FBC of the LP of the second set of pages is not less than the FBC of the LP of the first set of pages at block 670, then method 600 continues to block 642 of FIG. 6B, where the read thresholds of cell state E of the second set of pages are decreased by the DAC value. However, if the FBC of the LP of the second set of pages is less than the FBC of the LP of the first set of pages at block 670, then the controller 108 sets the FBC of the first set of pages equal to the FBC of the second set of pages at block 672. At block 674, the controller 108 decreases the read thresholds of cell state A of the second set of pages by the DAC value.

At block 676, the controller 108 senses the LP of the second set of pages and checks the FBC of the sensed LP. At block 678, the controller 108 determines if the FBC of the LP of the second set of pages is less than the FBC of the LP of the first set of pages. If the FBC of the LP of the second set of pages is not less than the FBC of the LP of the first set of pages at block 678, then method 600 continues to block 662 of FIG. 6C, where the read thresholds of cell state A of the second set of pages are increased by the DAC value. However, if the FBC of the LP of the second set of pages is less than the FBC of the LP of the first set of pages at block 678, then the controller 108 sets the FBC of the first set of pages equal to the FBC of the second set of pages at block 680. Method 600 returns to block 666.

It is to be understood that method 600 may iterate one or more times in order to optimize read threshold levels of one or more cell states of a TRT group. Furthermore, method 600 may allow for small adjustments and tracking of shifts of the read thresholds of cell states of the memory device (e.g., the NVM 110) during the operation of the data storage device 106. It is to be further understood that although cell states A and E are exemplified, the described embodiments may be applicable for the other cell states of the memory device. It is to be further understood that although a LP is exemplified, the described embodiments may be applicable for the other pages of the memory device, where the pages are substantially similar. For example, substantially similar pages may be pages that are in the same TRT group. In another example, a substantially similar page may be a first page of a first set of pages that is in the same TRT group as a first page of a second set of pages, where the first page of the first set of pages and the first page of the second set of pages are the same page. In some embodiments, described method may be implemented for the same page of the same set of pages.

By tracking movements of one or more read thresholds of one or more cell states of the memory device, adjustment of the one or more read thresholds during the data storage device operation may be more optimized, which may provide for better power utilization and latency performance. The technology disclosed allows for very simple tracking, which doesn't require extra resources from the system, and reduces the amount of read level reacquiring, which allows for better QoS/latency for the system. The present technology also allows simple controller systems such as for retail products like USB drives, the advantages of using better read thresholds providing better power and latency profiles.

In one embodiment, a data storage device includes a memory device and a controller coupled to the memory device. The controller is configured to determine a first read threshold for a first page, adjust a first read threshold voltage level associated with the first read threshold, determine a first adjusted read threshold at the adjusted first read threshold voltage level, where the adjusted first read threshold is different from the first read threshold, compare the adjusted first read threshold to the first read threshold, and calibrate the first read threshold based on the comparing.

The determining the first read threshold further includes determining a bit error rate (BER) at the first read threshold. The determining the adjusted first read threshold further includes determining an adjusted BER at the adjusted first read threshold. The determined BER and the determined adjusted BER is for the first page of the memory device. The memory device is a TLC memory device. The first page is either a lower page, a middle page, or an upper page. The memory device is a QLC memory device. The first page is either a lower page, a middle page, a upper page, or a top page. The comparing the adjusted first read threshold to the first read threshold includes comparing the determined BER to the determined adjusted BER. The calibrating the first read threshold further includes increasing the first read threshold voltage level or decreasing the first read threshold voltage level. The controller is further configured to iteratively: determine a second read threshold for a second page using the calibrated first read threshold, where the second page is substantially similar to the first page, adjust a second read threshold voltage level associated with the second read threshold, determine the adjusted second read threshold at the adjusted second read threshold voltage level, where the adjusted second read threshold is different from the second read threshold, compare the adjusted second read threshold to the second read threshold, and calibrate the second read threshold based on the comparing. The re-determined adjusted read threshold is different from the adjusted read threshold. The adjusting is by a digital to analog converter (DAC) shift level. The DAC shift level is about 12.5 mV.

In another embodiment, a data storage device includes a memory device and a controller coupled to the memory device. The controller is configured to read a first page at a target read threshold, calibrate the target read threshold, analyze a bit error rate (BER) difference based on the calibrating and/or a previous read threshold voltage level movement, and read a second page at the next target read threshold, where the second page is substantially similar to the first page.

The target read threshold is a read threshold for a same wordline of the first page from a previous adjacent block. The target read threshold is a threshold associated with a time and temperature (TRT) read threshold for the first page. The analyzing the BER difference includes determining a first BER and a second BER. The first BER is determined at the target read threshold and the second BER is determined at the calibrated target read threshold. The controller is further configured to shift the next target read threshold by a voltage shift two times in a positive voltage direction when the second BER is determined to be greater than the first BER. The controller is further configured to reset the first BER to equal the second BER. The controller is further configured to reset the first BER to equal the second BER when the second BER is determined to be equal to or less than the first BER. The target read threshold and the calibrated target read threshold are different.

In another embodiment, a data storage device includes memory means and a controller coupled to the memory means. The controller is configured to sense a first page at a first read threshold voltage and determine a first failed bit count (FBC) of the first page, decrease the first read threshold voltage of a first state of a second page by a voltage shift, sense the second page at the decreased first read threshold voltage and determine a second FBC of the second page, and compare the second FBC to the first FBC.

The controller is further configured to either: option 1: reset the first FBC equal to the second FBC when the second FBC is determined to be less than the first FBC, decrease a read threshold voltage of a second state of the second page by the voltage shift, and re-compare the second FBC to the first FBC, where the second FBC corresponds to a FBC of the second page at the decreased read threshold voltage of the second state, or option 2: increase the decreased read threshold voltage of the first state of the second page by the voltage shift, decrease the read threshold voltage of the second state of the second page by the voltage shift, and re-compare the second FBC to the first FBC, where the second FBC corresponds to a FBC of the second page at the decreased read threshold voltage of the second state.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a memory device; and
   a controller coupled to the memory device, the controller configured to:
   determine a first read threshold for a first page;
   adjust voltage level of the first read threshold;
   determine an adjusted first read threshold at the adjusted voltage level of the first read threshold, wherein the adjusted first read threshold is different from the first read threshold;
   compare the adjusted first read threshold to the first read threshold, wherein comparing the adjusted first read threshold to the first read threshold comprises:
   determining a bit error rate (BER) of the first page at the first read threshold;
   determining an adjusted BER of a second page at the adjusted first read threshold, wherein the second pane is adjacent to the first page; and
   determining that the adjusted BER of the second page is greater than or equal to the BER of the first page; and
   calibrate the first read threshold of the first page responsive to determining that the adjusted BER of the second page is greater than or equal to the BER of the first page.

2. The data storage device of claim 1, wherein determining the first read threshold further comprises determining a bit error rate (BER) at the first read threshold, and wherein determining the adjusted first read threshold further comprises determining an adjusted BER at the adjusted first read threshold.

3. The data storage device of claim 2, wherein the determined BER and the determined adjusted BER is for the first page of the memory device.

4. The data storage device of claim 3, wherein the memory device is a TLC memory device, and wherein the first page is either a lower page, a middle page, or an upper page.

5. The data storage device of claim 3, wherein the memory device is a QLC memory device, and wherein the first page is either a lower page, a middle page, a upper page, or a top page.

6. The data storage device of claim 2, wherein comparing the adjusted first read threshold to the first read threshold comprises comparing the determined BER to the determined adjusted BER.

7. The data storage device of claim 6, wherein calibrating the first read threshold further comprises increasing the voltage level of the first read threshold or decreasing the voltage level of the first read threshold.

8. The data storage device of claim 1, wherein the controller is further configured to iteratively:
   determine a second read threshold for a second page using the calibrated first read threshold;
   adjust voltage level of the second read threshold;
   determine the adjusted second read threshold at the adjusted voltage level of the second read threshold, wherein the adjusted second read threshold is different from the second read threshold;
   compare the adjusted second read threshold to the second read threshold; and
   calibrate the second read threshold based on the comparing.

9. The data storage device of claim 8, wherein the adjusted second read threshold is different from the second read threshold.

10. The data storage device of claim 1, wherein the adjusting is by a digital to analog converter (DAC) shift level, and wherein the DAC shift level is 12.5 mV.

11. A data storage device, comprising:
    a memory device; and
    a controller coupled to the memory device, the controller configured to:
    read a first page at a target read threshold;
    determine a bit error rate (BER) of the first page at the target read threshold;
    calibrate the target read threshold, wherein the calibrated target read threshold is different from the target read threshold;
    read a second page at the calibrated target read threshold, wherein the second page is adjacent to the first page;
    determine a BER of the second page at the calibrated read threshold; and
    shift the target read threshold of the first page responsive to determining that the BER of the of the second page is equal to or greater than the BER of the first page.

12. The data storage device of claim 11, wherein the target read threshold is a read threshold for a page adjacent to the first page, wherein the read threshold is a previously calibrated read threshold.

13. The data storage device of claim 11, wherein the target read threshold is a threshold associated with a time and temperature (TRT) read threshold for the first page.

14. The data storage device of claim 11, wherein the controller is further configured to shift the calibrated target read threshold by a voltage shift two times in a positive voltage direction when the BER of the second page is determined to be greater than the BER of the first page.

15. The data storage device of claim 14, wherein the controller is further configured to reset the first BER of the first page to equal the second BER of the second page.

16. The data storage device of claim 11, wherein the controller is further configured to reset the BER of the first page to equal the second BER of the second page when the BER of the second page is determined to be equal to or less than the BER of the first page.

17. The data storage device of claim 11, wherein the target read threshold and the calibrated target read threshold are different.

18. A data storage device, comprising:
 memory means; and
 a controller coupled to the memory means, the controller configured to:
 sense a first page at a first read threshold voltage and determine a first failed bit count (FBC) of the first page at the first read threshold voltage;
 determine an adjusted first read threshold voltage by decreasing the first read threshold voltage by a voltage shift, wherein the adjusted first read threshold voltage is different from the first read threshold voltage;
 sense the second page at the decreased first read threshold voltage and determine a second FBC of the second page at the adjusted first read threshold voltage, wherein the second pane is adjacent to the first page; and
 shift the first read threshold voltage of the first page responsive to determining that the second FBC of the second page is equal to or greater than the first FBC of the first page.

19. The data storage device of claim 18, wherein the controller is further configured to either:
 option 1:
 reset the first FBC equal to the second FBC when the second FBC is determined to be less than the first FBC;
 decrease a read threshold voltage of a second state of the second page by the voltage shift; and
 re-compare the second FBC to the first FBC, wherein the second FBC corresponds to a FBC of the second page at the decreased read threshold voltage of the second state; or
 option 2:
 increase the decreased read threshold voltage of the first state of the second page by the voltage shift;
 decrease the read threshold voltage of the second state of the second page by the voltage shift; and
 re-compare the second FBC to the first FBC, wherein the second FBC corresponds to a FBC of the second page at the decreased read threshold voltage of the second state.

\* \* \* \* \*